United States Patent [19]

Lind

[11] Patent Number: 4,704,585
[45] Date of Patent: Nov. 3, 1987

[54] RAPID FREQUENCY SYNTHESIZER APPARATUS AND METHOD

[75] Inventor: Harold V. Lind, Santa Ana, Calif.

[73] Assignee: Hughes Aircraft Company, Los Angeles, Calif.

[21] Appl. No.: 894,404

[22] Filed: Aug. 8, 1986

[51] Int. Cl.$^4$ .............................................. H03L 7/00
[52] U.S. Cl. ........................................ 331/14; 331/16; 331/17; 331/25; 375/1
[58] Field of Search ................. 331/1 A, 16, 17, 25, 331/14; 375/1, 2.2, 48, 65

[56] References Cited

U.S. PATENT DOCUMENTS 4,450,518  5/1984  Klee .............................. 331/1 A X
4,511,858  4/1985  Charavit et al. ..................... 331/10

Primary Examiner—Siegfried H. Grimm
Attorney, Agent, or Firm—A. W. Karambelas

[57] ABSTRACT

Rapid frequency synthesizer apparatus, particularly for use in high speed frequency hooping systems, includes a voltage controlled oscillator (VCO) and a memory in which are stored digital control voltage commands corresponding to the various frequencies to be synthesized by the VCO. A controller, responsive to channel selection commands, addresses the memory and causes the corresponding digital control voltage command to be generated. A digital-to-analog converter receives the digital control voltage command and converts it to an analog control voltage signal which is fed to the VCO. The resulting VCO output signal, at frequency, $f_{out}$, is compared in a frequency counter with a reference frequency $f_R$. The controller controls operation of the frequency counter so that a difference between the actual synthesized frequency and the programmed frequency is determined. Responsive to this difference, the controller causes the addressed control voltage command to be modified in a manner designed to reduce the difference the next time the same programmed frequency is selected. A corresponding method for providing rapid frequency synthesis is described.

11 Claims, 5 Drawing Figures

RAPID FREQUENCY SYNTHESIZER APPARATUS AND METHOD

BACKGROUND OF THE INVENTION

1. Field of the Invention:

The present invention relates generally to the field of frequency synthesizers and, more particularly, to high speed frequency synthesizers of the types commonly used in fast frequency hopping systems.

2. Description of Related Art:

The security and integrity of electronically transmitted information, including communications, is of extreme importance in many situations, both military and civilian. The ever-increasing sophistication of eavesdropping and interference techniques demands correspondingly improved and sophisticated secure communication apparatus and procedures on a continuing basis.

Typically, secure and anti-jamming or anti-interference communication systems employ some type of transmission signal transformation. An important type of transformation frequently used involves the periodic shifting of operating frequencies. For highly secure systems, the frequency shifting or hopping may be at a rate of thousands of hops per second, with the hopping being among many different frequencies in a relatively broad frequency band. To be effective against eavesdropping or interference, the frequency hopping is ordinarily on a pseudo-random basis; that is, the "random" frequency hopping schedule is known beforehand to the parties using the frequency hopping system or is incorporated in some manner into the equipment.

As mentioned above, system security and integrity is improved by increasing the frequency hopping rate and/or the number of frequencies used. As a result, one of the problems associated with high speed frequency hopping systems relates to generating a sufficiently large number of operating frequencies and in enabling the rapid transitions among these frequencies. One manner of providing the different frequencies is by using an individual crystal controlled oscillator for each frequency. In this case, it is only necessary to switch the different frequency oscillators "on-line" and "off-line" as the particular frequencies are used or not used. However, the use of a separate oscillator for each available (programmed) frequency is, for systems using a large number of hopping frequencies, very costly. Moreover, the cost, the weight and physical size of the resulting equipment is excessive for the typical mobile or transportable frequency hopping system.

As an alternative to using discrete frequency generators, most frequency hopping systems use frequency synthesizers; for example, voltage controlled oscillators (VCOs), which can generate (i.e., synthesize) frequencies over a broad band by means of a variable input control voltage.

Although use of frequency synthesizers is generally an improvement over use of discrete oscillators, at least for a many-frequency system, serious problems with fast frequency hopping have remained. A principal problem associated with the use of frequency synthesizers is that, for any particular control condition, such as a specific control voltage, the exact same frequency is not synthesized every time. Thus, due to such factors as aging of electronic components used in the synthesizer or equipment temperature changes, a specific control signal or command may result in the synthesis of one frequency at one time and slightly different frequencies at other times. Moreover, some or all of the synthesized frequencies might be outside of the required tolerance of the intended frequency.

Feedback is, therefore, generally provided in at least those frequency synthesizers which are required to rapidly hop among frequencies. Typically, a closed loop feedback is provided which enables comparing the synthesized frequency with the commanded frequency and which, responsive to the difference between the synthesized and commanded frequencies, adjusts the control signal within the synthesizer in a manner causing the synthesized frequency to converge towards the commanded frequency. Usually a number of frequency periods are required before the closed loop synthesized frequency converges into the tolerance range of the commanded frequency. Also, the closed loop frequency adjustments are intentionally made "on-line," i.e., during the same interval that the synthesizer frequency is being used for some purpose.

In known closed loop feedback frequency synthesizers, each time that a previously selected programmed frequency is re-selected, the corrective feedback adjustment of the control signal is repeated. Stated differently, when a programmed frequency is re-selected for synthesis closed loop frequency synthesizes do not have the capability for "learning" from past experience what corrective adjustments to the control signal should be applied.

Because the closed loop feedback adjustment is repeated each time a different frequency is selected for synthesis, the hopping rate among different frequencies is limited, and "dead time" must be allowed for a single synthesizer to settle. High speed frequency hopping systems are, as a result, often required to use several closed loop frequency synthesizers in a rotationally operated arrangement, often referred to as a carousel arrangement. In a typical carousel arrangement, such as one using four closed loop frequency synthesizers, each synthesizer is "on-line" only 25 percent of the time and is "off-line" while the three remaining synthesizers are sequentially "on-line". At the beginning of its "off-line" portion of the cycle, each carousel-arranged synthesizer is provided the control signal for its subsequent "on-line" portion of the cycle so that the above-described feedback adjustment of the oscillator control signal is substantially or totally completed for a synthesizer before it is switched "on-line."

Although such carousel arrangements of frequency synthesizers in a frequency hopping system typically enable quite rapid frequency hopping, the use of several frequency synthesizers, together with associated selection and control circuits, significantly increase system cost as well as size and weight over that for a system achieving the same performance using only one frequency synthesizer. Improvements in high speed frequency synthesizers used in frequency hopping systems are, therefore, needed to improve performance and reduce system cost, size and weight.

Accordingly, an object of the present invention is to provide a novel, high speed frequency synthesizer having the capability for generating and applying frequency control signal corrections based on synthesized frequency errors determined during previous uses of that same "channel."

Another object of the present invention is to provide a novel, high speed frequency synthesizer which has a memory for storing a set of frequency control commands, each corresponding to a different frequency to be synthesized, and an open feedback loop which enables each control command to be correctively modified for future use in accordance with the measured or estimated error between a frequency actually synthesized and the corresponding commanded frequency.

Other objects, features and advantages of the present invention will become apparent from the following detailed description.

SUMMARY OF THE INVENTION

Rapid frequency synthesize apparatus, according to the present invention, comprises a controllable oscillator, memory mean for storing a plurality of different oscillator control commands corresponding to a like plurality of different programmed frequencies to be synthesized by the oscillator, and selecting means enabling selection among the programmed frequencies. Included are control means, responsive to the selection of any one of the programmed frequencies, for selecting the corresponding oscillator control command stored in the memory and for applying such command to the oscillator, the oscillator being responsive to the applied command to synthesize an actual output frequency corresponding to the selected programmed frequency.

Means are also included in the apparatus for comparing the frequency actually synthesized with the corresponding selected programmed frequency, for determining an eror difference therebetween and, in response to the error difference, for modifying the associated oscillator control command in a manner designed to reduce the error difference between the synthesized frequency and the programmed frequency during the next time period that the same programmed frequency is to be provided as an "on-line" output while being synthesized.

Preferably, the oscillator is a voltage controlled oscillator and the stored oscillator control commands are control voltage commands. Also preferably, the control voltage commands are stored in the memory means in digital form, the apparatus then including digital-to-analog converting means for converting the selected binary control command into a corresponding analog control signal which is applied to the oscillator to cause the selected frequency to be synthesized.

A corresponding method for high speed frequency synthesis comprises storing a plurality of different oscillator control commands, preferably in digital form, corresponding to a like plurality of different programmed frequencies to be synthesized by the oscillator, and then mechanizing the selection of each particular programmed frequency by selecting the corresponding stored oscillator control command.

Included in the method are the steps of (1) applying the selected control commands to the oscillator, to thereby cause the oscillator to synthesize frequencies corresponding to the selected programmed frequencies, (2) comparing the frequencies actually synthesized with the corresponding selected programmed frequencies, and (3) determining error differences therebetween. Further included is the step (4) of modifying the selected control commands, in response to the determined error differences, in a manner designed to reduce the error difference during subsequent time periods that the same programmed frequency is scheduled to be an "on-line" output of the synthesizer.

It is preferred that the step of storing the plurality of control commands includes storing a plurality of control voltage commands when, as is also preferred, the oscillator is a voltage controlled oscillator. In a preferred embodiment, the control commands are stored in the memory in digital form. The method would then include the step of converting the selected control commands from the digital form to an analog form, the analog form being provided to the oscillator.

The present invention thus provides for repeatedly updating the control commands stored in the apparatus memory. Based upon differences between frequencies actually synthesized by the apparatus and programmed frequencies intended to be synthesized by the apparatus, the control commands are updated so that, in the future, when the same frequencies are to be output while being synthesized, the error differences between the frequencies actually synthesized and the corresponding programmed frequencies will typically remain within tolerable limits after once having been reduced below those limits. The feedback enabling such control command updating is termed "open loop" to signify that the updating is done "off-line" from the use of the corresponding synthesized frequency. This is in contrast to the typical, known approach of using "closed-loop" feedbacks, wherein attempts are made to converge the frequency being synthesized to the programmed "on-line" frequency while the synthesized frequency is still being output or used for some purpose.

BRIEF DESCRIPTION OF THE DRAWINGS

The present invention may be better understood by a consideration of the accompanying drawings in which.

DESCRIPTION OF THE PREFERRED EMBODIMENTS

Figure 1:
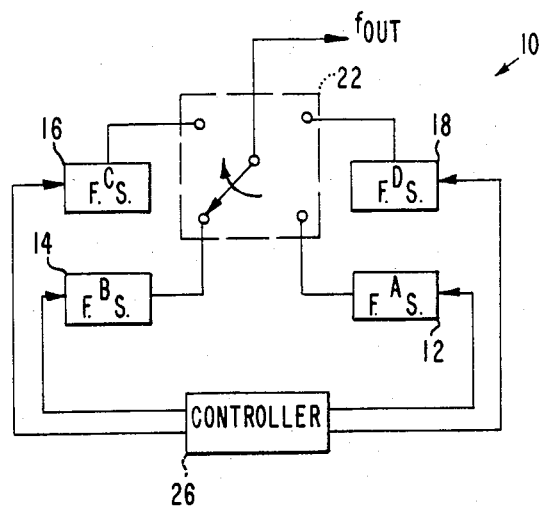
FIG. 1 is a functional block diagram of a conventional, carousel-type, frequency hopping system having four sequentially operated, closed feedback loop frequency synthesizers.

The present invention, involving rapid frequency synthesizer apparatus, can be better understood by a further brief consideration of conventional closed loop frequency hopping apparatus of the above-mentioned carousel type. FIG. 1 accordingly depicts, in functional block diagram form, a carousel-type frequency synthesizer apparatus 10, which includes respective first through fourth closed-loop frequency synthesizers 12, 14, 16 and 18. Included in apparatus 10 are a controller 20 and a rotary switch 22. Synthesizers 12-18 are sequentially switched, in a rotational manner, by switch 22 so that each such VCO synthesizer is "on line," (i.e., feeding an output line) once during sequence of each four frequency shifting (or hopping) intervals. Each such synthesizer 12-18 is, as a result, switched "on-line"

for one hopping interval and is "off line" for the next three hopping intervals. The frequencies to be synthesized by synthesizers 12-18 are selected in a predetermined "random" order by controller 20. The frequency to be synthesized by each synthesizer 12-18 is established at the beginning of its three hopping intervals of "off-line" time before the synthesizer is switched "on-line."

Figure 2:
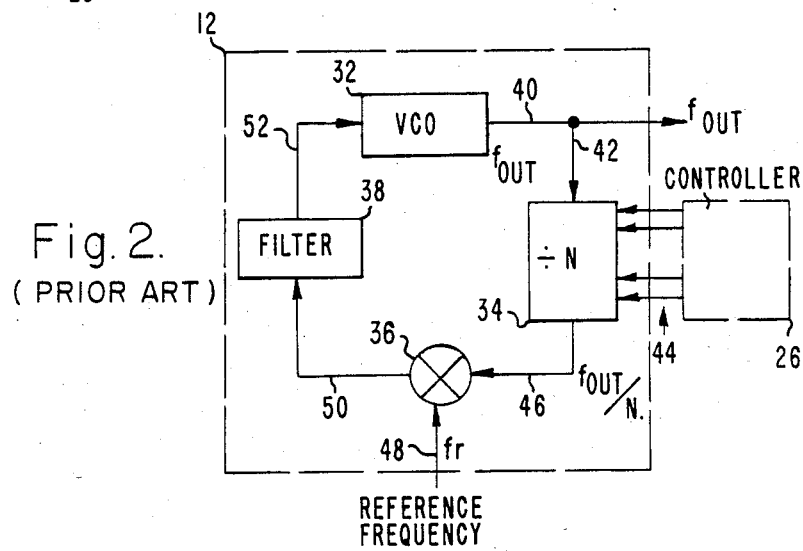
FIG. 2 is a functional block diagram of a representative one of the closed loop frequency synthesizers of FIG. 1 showing the closed feedback loop.

FIG. 2 shows, in functional block diagram form, a conventional known manner in which synthesizers 12-18 may be implemented, the implementation of first synthesizer 12 being shown as representative of all the synthesizers. Shown comprising synthesizer 12 are a voltage controlled oscillator (VCO) 32, a divide-by-N ($\div$N) circuit 34, a frequency mixer or phase detector 36 and a feedback filter 38. The $\div$N circuit 34, mixer 36 and filter 38 are series interconnected so as to provide a closed, control voltage-correcting, feedback loop from the output of the VCO back to the input thereof.

As can be seen from FIG. 2, the closed-loop synthesized output frequency signal of frequency $f_{out}$, on an output line 40, is sampled and input on a line 42 to $\div$N circuit 34. Frequency control signals, consisting of frequency numbers $N_i$, each corresponding to a frequency to be synthesized by oscillator 32, are input to $\div$N circuit 34 on a line (or plurality of lines) 44. Within $\div$N circuit 34, the output signal frequency, $f_{out}$, is divided by the particular input frequency control number $N_i$ which corresponds to the desired output frequency, $f_{out}$. From $\div$N circuit 34, a signal corresponding to $f_{out/Ni}$ is fed, by a line 46, to mixer 36 which also receives a reference signal, having a fixed reference frequency $f_R$, over a line 48 connected to a reference frequency oscillator (not shown). The particular frequency control number, $N_i$ provided to $\div$N circuit 34 is such that $f_{out/Ni}$ is equal to $f_R$.

The results of frequency mixing the $f_R$ and $f_{out/Ni}$ frequency signals in mixer 36 are fed, over a line 50, to filter 38 which in turn provides, over a line 52, a control signal to VCO 12. Such control signal to VCO 12 is such that the closed loop synthesizer frequency, $f_{out}$, is converged towards the corresponding programmed frequency, ($N_i \times f_R$).

Figure 3:
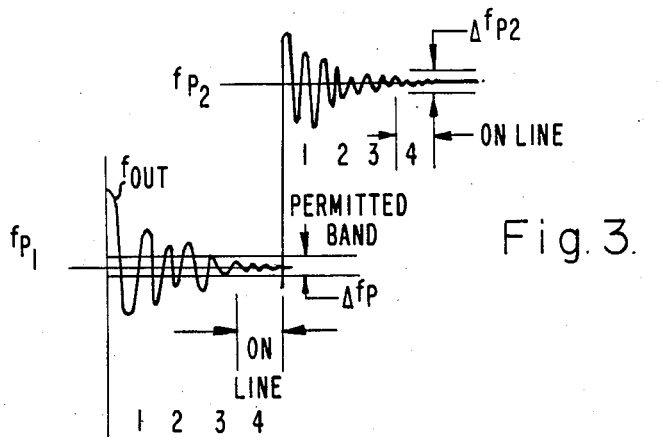
FIG. 3 is a representative graph showing synthesizer output frequency as a function of time for the frequency synthesizer of FIG. 2.

FIG. 3 depicts, in graph form, the converging with time of the synthesized output frequency, $f_{out}$, towards a corresponding initial programmed frequency, $f_P$, by operation of the above-described feedback loop. At the beginning of the three hop intervals prior to synthesizer 12 being switched "on-line," a command signal, $N_1$, corresponding to the frequency to be synthesized is applied, by controller 20, to $\div$N circuit 34. Typically, a number of cycles of the output signal are required before the synthesized frequency, $f_{out}$, is caused to converge into an allowable frequency error band $\Delta f_{p1}$ around the programmed frequency, $f_{P1}$. Typically, by the end of the third hop interval, when synthesizer 12 is switched "on-line," the synthesized frequency, $f_{out}$, will have been converged into the $\Delta f_{p1}$ band so that during the fourth (i.e., the "on-line") hop interval, the synthesized frequency, $f_{out}$, will be sufficiently close to the programmed frequency, $f_{P1}$, that further convergence is unnecessary.

At the end of the fourth hop interval, when synthesizer 12 is switched "off-line," a next frequency, $f_{P2}$, is scheduled to be synthesized by the synthesizer and the above-described converging of the synthesized frequency towards the new programmed frequency occurs. At some later time (not shown), when synthesizer 12 is again scheduled to synthesize the first programmed frequency, $f_{P1}$, the entire frequency converging process previously associated with $f_{P1}$ is repeated because the closed-loop synthesizer has no provision for "remembering" the correct control voltage to be applied to VCO 32 to cause the synthesized frequency to equal the programmed frequency.

In contrast, as more particularly described below, the rapid, open loop frequency synthesizer of the present invention includes memory provisions enabling VCO voltage commands to be modified according to the actual voltages previously applied to the VCO while it synthesized particular commanded frequencies. Stated differently, the synthesizer of the present invention has the capability of remembering and using results of its present frequency tuning operations during its future tuning operations so that the above-described output frequency converging process is not required each time a frequency hop occurs.

Figure 4:
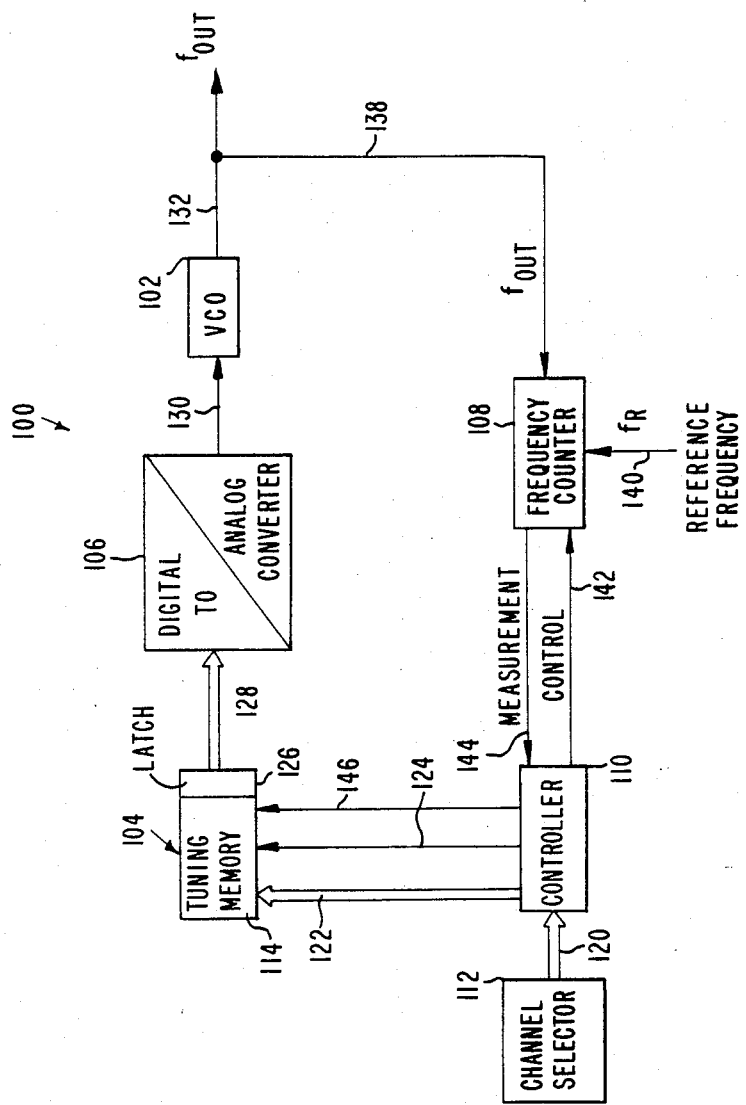
FIG. 4 is a functional block diagram of the rapid, open loop frequency synthesizer apparatus of the present invention showing connection of the open feedback loop.

Shown in FIG. 4 is a rapid frequency synthesizer apparatus 100 according to the present invention. Comprising frequency synthesizer apparatus 100, which may be considered an open-loop frequency synthesizer apparatus, in contrast to the above-described closed loop synthesizers 12, 14, 16 and 18 (FIGS. 1 and 2), are a VCO 102, a tuning memory or memory means 104, a digital-to-analog (D/A) converter 106, a frequency counter or comparator 108, a microprocessor-type controller 110 and a channel selecter 112.

In general, voltage commands or words, corresponding to programmed frequencies to be synthesized by VCO 102, are stored in digital form in a memory portion 114 of memory means 104. Preferably, this memory portion comprises a conventional random access memory (RAM) circuit of appropriate memory capacity.

According to a pseudo-random schedule, programmed frequencies to be synthesized by VCO 102 are selected by channel selector 112. This channel selection is fed through a line 120 to controller 110 which, in response thereto, provides corresponding control voltage command addresses to memory portion 114 via an address line 122. "Read" commands are also provided by controller 110 to memory portion 114 via a "read" line 124.

Digital voltage commands, retrieved from the addressed locations in memory portion 114, are internally fed into a latch portion 126 and from there through a line 128 into D/A converter 106. The digital voltage commands received by D/A converter 106 are converted therein into analog control voltage signals which are fed through a line 130 to VCO 102. In response to receiving such voltage control signals, VCO 102 synthesizes a corresponding output frequency, $f_{out}$, which is provided on an output line 132.

If the various voltage commands corresponding to the various selectable, programmed frequencies to be synthesized by VCO 102 were correct when initially stored in memory portion 114, and if no system changes ever occurred, then the voltage commands would always result in the correct output frequency, $f_{out}$, being synthesized by VCO 102. However, as mentioned above, parameters of the electronic components used to construct the system change as the components age and also change in response to temperature changes of the components. As a result, even assuming that correct control voltage comands were initially stored in memory means 114, these voltage commands do not necessarily continue, over an interval of time, to provide VCO synthesized output frequencies, $f_{out}$, which are, for the frequencies selected, within allowable frequency tolerances.

Therefore, frequency synthesizer apparatus 100 provides for the repeated updating (modifying) of the control voltage commands stored in memory portion 114 of memory means 104. In general, such control voltage command updating is performed after each frequency shift (hop) so that an updated control voltage command is stored in memory portion 114 for use the next time the same programmed frequency is selected, by channel selector 112, for synthesizing. Attempts are not made to change or converge a synthesized frequency during "on-line" use of that frequency as it is being output on line 132. Instead, during each frequency sample period, the output is sampled and the difference between the actual output frequency and the programmed (intended) frequency is determined. Based on this difference determination, the corresponding digital control voltage command in memory portion 114 is modified in a manner calculated to cause the difference between the actual synthesized frequency and the corresponding programmed frequency to be eliminated, or at least substantially reduced, the next time that same frequency is selected for synthesizing. Thus, based on a present frequency difference voltage command, modifications are made affecting the future operation of the synthesizer. Each time any programmed frequency is synthesized and outputted by VCO 102 during a sample period, the actual output frequency is compared with the programmed frequency and, responsive to difference therebetween, the corresponding control voltage command is modified for future use.

In this regard, it will be appreciated that the greatest differences between actual synthesized frequencies and the corresponding programmed frequencies are expected to occur when synthesizer apparatus 100 is initially turned on after an idle, off period. Since the frequency hopping rate may be thousands of times per second, each programmable frequency will, on the average, be selected a great many times each second. As a result, any large initial differences between actual and programmed frequencies will be compensated for during the initial short warm-up period of the apparatus when the apparatus is not normally used for important transmissions. Thereafter, because each programmed frequency is selected, even on a random basis, many times a second, substantial or even significant frequency changes are not expected to occur between the sequential selections of the same frequency.

The feedback loop of synthesizer apparatus 100, including frequency counter 108, controller 110 and memory means 104, does not change the output frequency of VCO 102 while this frequency is actually being synthesized and the synthesizer output is "on-line" for intended use by external equipment (not shown) connected to line 132. Therefore, the feedback loop is referred to as an open-loop feedback rather than as a closed-loop feedback, as in above-described, known synthesizer 10.

More specifically, frequency counter 108 is connected to receive, on a line 138 (FIG. 4), a sample of the VCO output frequency signal on line 132 and a reference frequency, $f_R$, signal on a line 140. Responsive to a control signal received on a line 142 from controller 110, the output frequency, $f_{out}$, and the reference frequency, $f_R$, are compared to one another. A resulting difference signal is transmitted via a line 144 from frequency counter 108 to controller 110. In response to the frequency difference signal from frequency counter 108, controller 110 determines the manner in which the corresponding control voltage command word stored in memory portion 114 should be modified and a command causing such word modification is transmitted from the controller to the memory portion over a "write" line 146.

Figure 5:
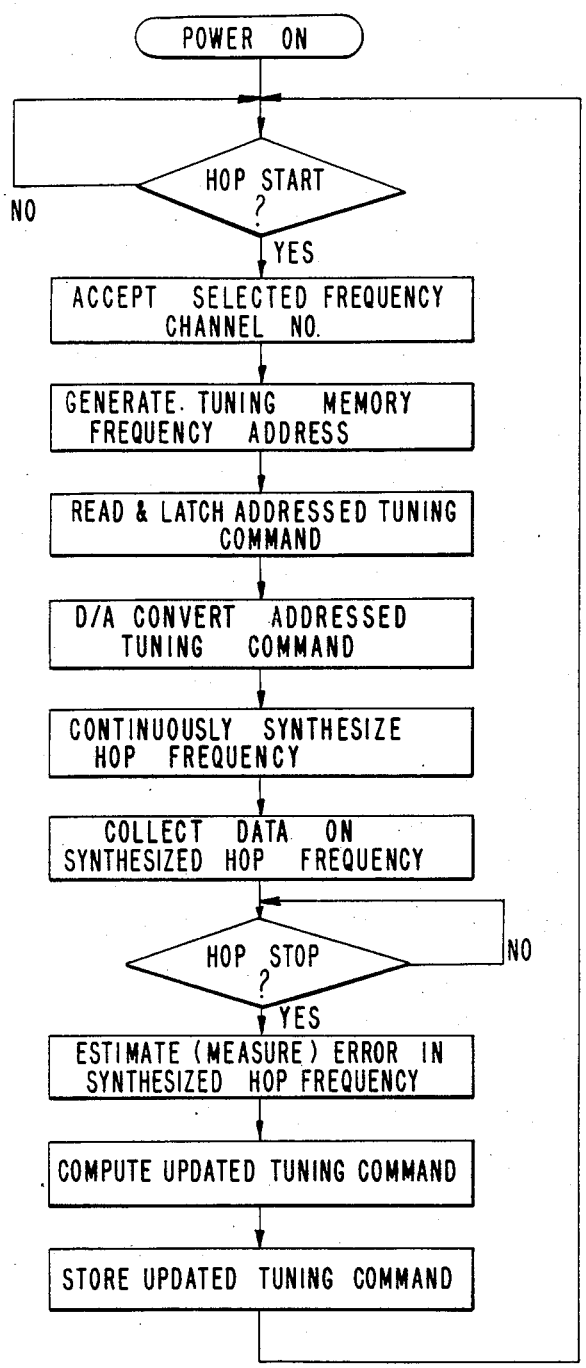
FIG. 5 is a flow diagram depicting overall operation of control portions of the synthesizer apparatus of FIG. 4.

It will be appreciated that controller 110 may be implementd so as to perform its above-described functions in a number of different manners which will be apparent to those skilled in the art. By way of specific example, however, with no limitations thereto intended or implied, FIG. 5 shows a flow diagram of one way to implement the functions of controller 110. Inasmuch as FIG. 5 is self-explanatory, it will not be further described herein.

A corresponding method for implementing a rapid, open loop frequency synthesizer apparatus includes storing, in a memory, digital control voltage commands corresponding to selectable frequencies to be synthesized, providing such control voltage commands, upon demand, to a D/A converter for converting into analog voltage signals and providing the analog voltage signals to a VCO. The method further provides for sampling the VCO output frequency signal, determining the error difference between the actual output frequency and the programmed frequency and, responsive to such error difference, for modifying the coresponding stored control voltage command in the memory in a manner eliminating or substantially reducing the error difference the next time the same programmed frequency is selected for synthesizing.

Although there has been described above a specific arrangement of a rapid frequency synthesizing apparatus for purposes of illustrating the manner in which the invention may be used to advantage, it is to be understood that the invention is not limited thereto. Accordingly, any and all variations or modifications which may occur to those skilled in the art are to be understood to be within the scope and spirit of the appended claims.

What is claimed is:

1. Rapid frequency synthesizer apparatus which comprises:
    (a) a controllable oscillator;
    (b) memory means for storing a plurality of different oscillator control commands corresponding to a like plurality of different programmed frequencies to be synthesized by said oscillator;
    (c) selecting means enabling the external selecting among said programmed frequencies;
    (d) control means responsive to the external selecting of any one of said programmed frequencies for internally selecting the corresponding one of the oscillator control commands stored in the memory means and for applying said selected oscillator control command to said oscillator,
    said oscillator being responsive to said selected oscillator control command provided thereto for synthesizing a present actual output frequency corresponding to the selected programmed frequency;
    (e) means for comparing said present actual output frequency synthesized with said corresponding selected programmed frequency and for determining a present error difference therebetween; and (f) means responsive to said present error difference for modifying the selected oscillator control command stored in the memory means in a manner designed to reduce a corresponding error difference the next time the same programmed frequency is selected without changing said present error difference.

2. The frequency synthesizer apparatus as claimed in claim 1 wherein said oscillator is a voltage controlled oscillator.

3. The frequency synthesizer apparatus as claimed in claim 2 wherein said oscillator control commands comprise control voltage commands.

4. The frequency synthesizer apparatus as claimed in claim 3 wherein said control voltage commands are stored in the memory means as digital words and including digital-to-analog converting means for converting said digital words into analog oscillator control voltages.

5. Rapid frequency synthesizer apparatus which comprises:
(a) a voltage controlled oscillator;
(b) memory means for storing a plurality of different oscillator control voltage commands corresponding to a like plurality of different programmed frequencies to be synthesized by the voltage controlled oscillator;
(c) selecting means enabling the external selecting among said programmed frequencies;
(d) control means responsive to the external selecting of any one of said programmed frequencies for internally selecting the corresponding one of the oscillator control voltage commands stored in the memory means and for applying said selected control voltage command to said voltage controlled oscillator,
    said voltage controlled oscillator being responsive to said selected control voltage command for synthesizing a present actual output frequency corresponding to the selected programmed frequency;
(e) means for comparing said present actual output frequency with said corresponding selected programmed frequency and for determining a present error difference therebetween; and
(f) means responsive to said present error difference for modifying the selected control voltage command stored in the memory means in a manner designed to reduce a corresponding error difference the next time the same programmed frequency is selected without changing said present error difference.

6. The frequency synthesizer apparatus as claimed in claim 5 wherein said control voltage commands are stored in the memory means in digital format and including digital-to-analog converting means for converting the control voltage commands from the digital format to analog oscillator control voltages.

7. Rapid frequency synthesizer apparatus which comprises:
(a) a voltage controlled oscillator;
(b) memory means for storing, in digital format, a plurality of different oscillator control voltage commands corresponding to a like plurality of different programmed frequencies to be synthesized by said voltage controlled oscillator;
(c) selecting means enabling the external selecting among said programmed frequencies;
(d) control means responsive to the external selecting of any one of the programmed frequencies for internally selecting the corresponding one of the stored control voltage commands;
(e) digital-to-analog-converting means connected for receiving said selected control voltage commands from the memory means and for applying, in response thereto, a corresponding analog control voltage to the oscillator,
    said oscillator being responsive to said corresponding analog control voltage for synthesizing a present actual output frequency corresponding to the selected programmed frequency;
(f) means for sampling the present actual output frequency of the voltage controlled oscillator, for comparing said present actual output frequency with said selected programmed frequency and for providing a present error difference between said present actual and programmed frequencies; and
(g) means responsive to said present error difference for modifying the selected control voltage command stored in the memory means in a manner designed to reduce a corresponding error difference the next time the same programmed frequency is selected without changing said present error difference.

8. A method for rapid frequency synthesizing which comprises:
(a) storing in a memory a plurality of different oscillator control commands corresponding to a like plurality of different programmed frequencies to be synthesized;
(b) selecting a particular one of the programmed frequencies to be synthesized and thereby also selecting a corresponding particular one of the stored oscillator control commands;
(c) applying said selected oscillator control command to a frequency synthesizing oscillator to cause said oscillator to provide a present actual output frequency;
(d) comparing the present actual output frequency of the oscillator to the selected one of the programmed frequencies and determining a present error difference therebetween; and
(e) modifying the corresponding particular one of the stored oscillator control commands in response to said present error difference in a manner designed to reduce a corresponding error difference the next time said particular one of the programmed frequencies is to be provided without changing said present error difference.

9. The method as claimed in claim 8 wherein the oscillator voltage commands are stored in digital form in the memory and wherein the oscillator is responsive to analog control commands and including the step of converting the selected one of the oscillator control commands to a corresponding analog control command.

10. The method as claimed in claim 8 wherein the oscillator is a voltage controlled oscillator and wherein the oscillator control commands are voltage commands.

11. A method for rapid frequency synthesizing which comprises:
(a) storing in a random access memory, in digital form, a plurality of different control voltage commands corresponding to a like plurality of different programmed frequencies to be synthesized;

(b) selecting a particular one of the programmed frequencies to be synthesized and thereby also selecting a corresponding one of the stored control voltage commands;

(c) extracting from the memory said selected one of the digital control voltage commands and converting said command to a corresponding analog voltage command;

(d) applying said corresponding analog voltage command to a voltage controlled oscillator to cause the oscillator to synthesize a corresponding present actual frequency;

(d) comparing the present actual synthesized frequency with the selected frequency and determining a present error difference therebetween; and (e) modifying, in response to said present error difference, the selected one of the control voltage commands stored in the memory in a manner designed to reduce a corresponding error difference the next time said particular one of the programmed frequencies is to be provided without changing said present error difference.

* * * * *